(12) United States Patent
Pratt

(10) Patent No.: US 12,014,088 B2
(45) Date of Patent: *Jun. 18, 2024

(54) MEMORY SUB-SYSTEM STORAGE MODE CONTROL

(71) Applicant: Micron Technology, Inc., Boise, ID (US)

(72) Inventor: Thomas Pratt, Austin, TX (US)

(73) Assignee: Micron Technology, Inc., Boise, ID (US)

( * ) Notice: Subject to any disclaimer, the term of this patent is extended or adjusted under 35 U.S.C. 154(b) by 0 days.

This patent is subject to a terminal disclaimer.

(21) Appl. No.: 17/887,900

(22) Filed: Aug. 15, 2022

(65) Prior Publication Data

US 2022/0391145 A1 Dec. 8, 2022

Related U.S. Application Data

(63) Continuation of application No. 16/990,913, filed on Aug. 11, 2020, now Pat. No. 11,416,177.

(51) Int. Cl.
*G06F 12/00* (2006.01)
*G06F 3/06* (2006.01)
*G11C 11/56* (2006.01)
*G11C 13/00* (2006.01)
*G11C 16/04* (2006.01)

(52) U.S. Cl.
CPC .......... *G06F 3/0659* (2013.01); *G06F 3/0604* (2013.01); *G06F 3/0647* (2013.01); *G06F 3/0673* (2013.01); *G11C 11/56* (2013.01); *G11C 13/0002* (2013.01); *G11C 16/0483* (2013.01)

(58) Field of Classification Search
CPC .... G06F 3/0659; G06F 3/0604; G06F 3/0647; G06F 3/0673; G06F 3/061; G06F 3/0634; G06F 3/0679; G06F 3/068; G06F 3/0602; G06F 3/0616; G06F 3/064; G11C 11/56; G11C 13/0002; G11C 16/0483; G11C 7/1006; G11C 7/1015; G11C 2211/5641; G11C 2211/5646; G11C 2213/71; G11C 11/5628; G11C 16/10
See application file for complete search history.

(56) References Cited

U.S. PATENT DOCUMENTS

| | | |
|---|---|---|
| 8,078,794 B2 | 12/2011 | Lee et al. |
| 8,234,466 B2 | 7/2012 | Yeh |
| 8,667,215 B2 | 3/2014 | Marotta et al. |
| 2013/0173844 A1 | 7/2013 | Chen |
| 2015/0213896 A1 | 7/2015 | Lieber |
| 2018/0032275 A1 | 2/2018 | Pahwa |

FOREIGN PATENT DOCUMENTS

WO 2012174216 A2 12/2012

*Primary Examiner* — Arvind Talukdar
(74) *Attorney, Agent, or Firm* — Brooks, Cameron & Huebsch, PLLC

(57) ABSTRACT

A system includes a memory device and a processing device coupled to the memory device. The memory device can include memory cells. The processing device can store operation system data in the memory cells in a single level cell (SLC) mode. The processing device can assert a flag indicating that the data written to the memory cells in the SLC mode is to remain stored in the SLC mode. The processing device can de-assert the flag, thereby indicating that the data is foldable into memory cells in a non-SLC mode.

20 Claims, 5 Drawing Sheets

470 ↘

┌─────────────────────────────────────────────────────────┐
│ PREVENTING OPERATING SYSTEM OR VENDOR-SPECIFIC DATA     │
│ WRITTEN TO MEMORY CELLS OF A MEMORY DEVICE IN           │──471
│ A SINGLE LEVEL CELL (SLC) MODE FROM BEING STORED IN     │
│ MEMORY CELLS IN A NON-SINGLE LEVEL CELL (NON-SLC) MODE  │
└─────────────────────────────────────────────────────────┘

┌─────────────────────────────────────────────────────────┐
│ IN RESPONSE TO PERFORMANCE OF A PARTICULAR QUANTITY OF  │
│ POWER CYCLES OF THE MEMORY DEVICE, ALLOWING             │
│ THE OPERATING SYSTEM OR VENDOR-SPECIFIC DATA WRITTEN TO │──473
│ THE MEMORY CELLS IN THE SLC MODE TO BE STORED IN        │
│ MEMORY CELLS IN THE NON-SLC MODE                        │
└─────────────────────────────────────────────────────────┘

*FIG. 4*

MEMORY SUB-SYSTEM STORAGE MODE CONTROL

PRIORITY INFORMATION

This application is a Continuation of U.S. application Ser. No. 16/990,913, filed on Aug. 11, 2020, the contents of which are incorporated herein by reference.

TECHNICAL FIELD

Embodiments of the disclosure relate generally to memory sub-systems, and more specifically, relate to memory sub-system memory storage mode control.

BACKGROUND

A memory sub-system can include one or more memory devices that store data. The memory devices can be, for example, non-volatile memory devices and volatile memory devices. In general, a host system can utilize a memory sub-system to store data at the memory devices and to retrieve data from the memory devices.

BRIEF DESCRIPTION OF THE DRAWINGS

The present disclosure will be understood more fully from the detailed description given below and from the accompanying drawings of various embodiments of the disclosure.

FIG. 4 is a flow diagram corresponding to a method for performing memory sub-system operations to control memory cell type in accordance with some embodiments of the present disclosure.

DETAILED DESCRIPTION

Figure 1:
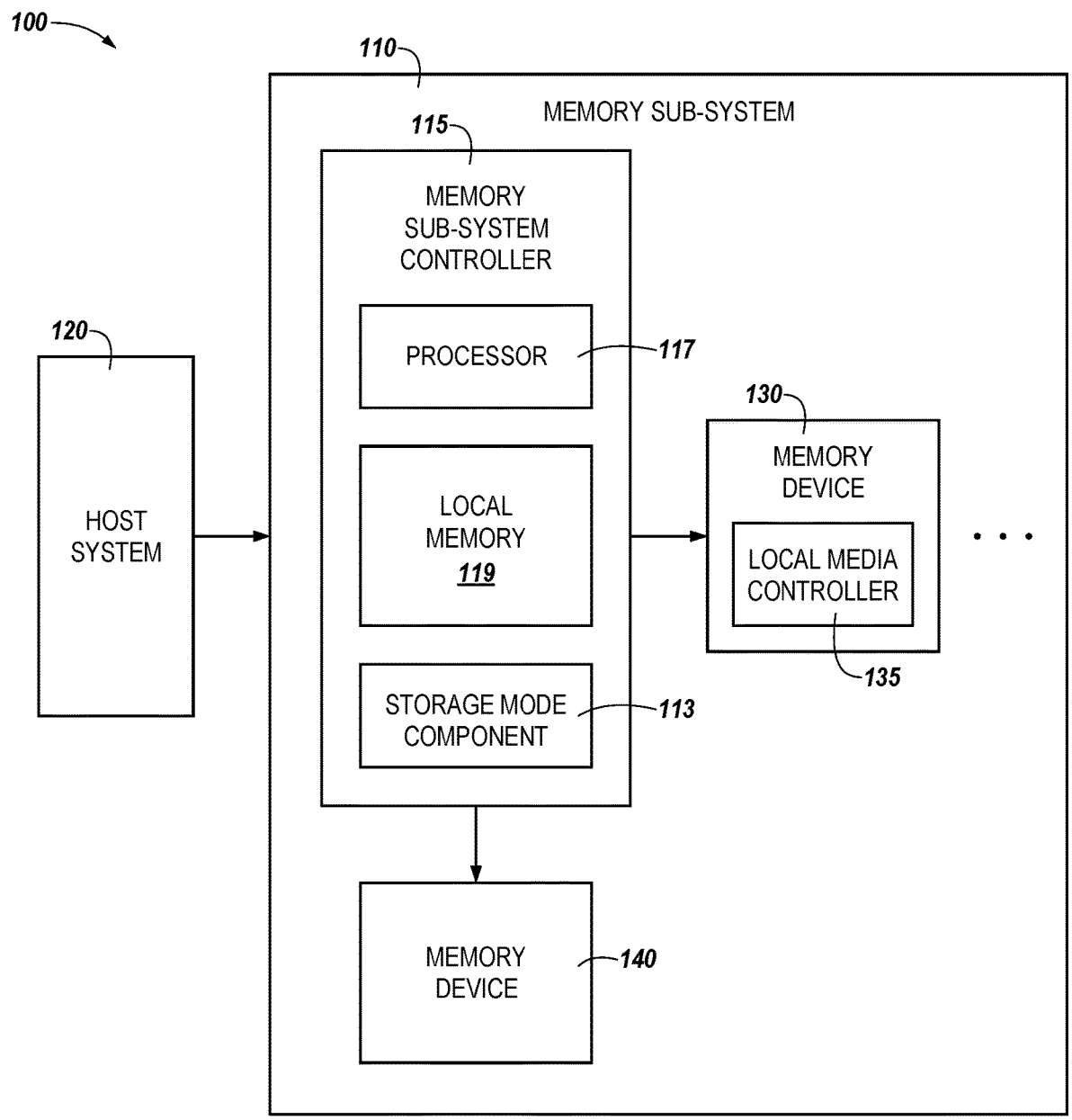
FIG. 1 illustrates an example computing system that includes a memory sub-system in accordance with some embodiments of the present disclosure.

Aspects of the present disclosure are directed to memory storage mode control associated with a memory sub-system, in particular to memory sub-systems that include a storage mode component. A memory sub-system can be a storage device, a memory module, or a hybrid of a storage device and memory module. An example of a memory sub-system is a storage system, such as a solid state drive (SDD). Examples of storage devices and memory modules are described below in conjunction with FIG. 1. In general, a host system can utilize a memory sub-system that includes one or more components, such as "memory devices" that store data. The host system can provide data to be stored at the memory sub-system and can request data to be retrieved from the memory sub-system.

An SSD is a type of memory sub-system that uses integrated circuit assemblies to store data persistently, typically using flash memory. An SSD can include memory devices that include one or more arrays of memory cells. The performance, endurance, and/or retention of an SSD can be related to the type(s) of memory cells employed by the SSD. In general, as the quantity of bits stored per cell increases, the sensitivity of retention (the ability to maintain stored data integrity over a specified length of time) of the memory cell to fluctuations in temperature tends to increase. A retention failure can lead to errors and can cause events that are performed by the SSD to fail or not occur correctly. Temperature fluctuations can occur for extended periods of time during transportation of an SSD post-manufacturing. As an example, memory cells storing data in a single-level cell (SLC) mode can be less susceptible to damage due to high temperature fluctuations than a memory cell storing data in a non-SLC (e.g., multi-(MLC), tri-(TLC), or quad-(QLC), penta-(PLC) level cell mode).

By limiting storage of data to memory cells in an SLC mode, the negative impact of higher temperature fluctuations can be beneficially limited. Further, limiting storage of the data to an SLC mode can provide a more beneficial experience to a user during a first or initial startup of the system. For example, memory cells in an SLC mode can be accessed and written to faster and thereby provide an improved initial user experience. The storage of data can be limited to memory cells in an SLC mode by asserting (e.g., setting) a flag in the SSD that indicates to store data in the SLC mode. Further, an additional flag can be asserted that indicates to maintain the stored data in memory cells in the SLC mode. In this way, the data stored in the SLC mode can be prevented from being transferred to memory cells in a non-SLC mode. As an example, data can be folded from being stored in a memory cell in an SLC mode to being stored in a memory cell in a non-SLC mode. This folding can occur during a garbage collection operation or other operations that are meant to provide more efficient storage of the data in the SSD.

Aspects of the present disclosure address the above and other deficiencies by maintaining data storage in memory cells in an SLC mode during the manufacturing process and prior to startup of the SSD by an end-user. In this way, errors created by environmental factors such as high temperature can be minimized. In addition, the end-user can experience a faster and more efficient start-up due to the data still being stored in an SLC mode. This is due to data stored in an SLC mode being accessed faster than data stored in a non-SLC mode. An advantage of the present disclosure includes minimizing damage to the data stored in the SSD and providing a faster initial startup for a user. Embodiments described herein include a storage mode component resident on the memory sub-system (e.g., on the memory sub-system controller), to make it possible to control the storage mode of the memory sub-system.

FIG. 1 illustrates an example computing system 100 that includes a memory sub-system 110 in accordance with some embodiments of the present disclosure. The memory sub-system 110 can include media, such as one or more volatile memory devices (e.g., memory device 140), one or more non-volatile memory devices (e.g., memory device 130), or a combination of such.

A memory sub-system 110 can be a storage device, a memory module, or a hybrid of a storage device and memory module. Examples of memory modules include a dual in-line memory module (DIMM), a small outline DIMM (SO-DIMM), and various types of non-volatile dual in-line memory modules (NVDIMM). Examples of a storage device include a solid-state drive (SSD), a flash drive, a universal serial bus (USB) flash drive, an embedded Multi-Media Controller (eMMC) drive, a Universal Flash Storage (UFS) drive, a secure digital (SD) card, and a hard disk drive (HDD).

The computing system 100 can be a computing device such as a desktop computer, laptop computer, network server, mobile device, a vehicle (e.g., airplane, drone, train, automobile, or other conveyance), Internet of Things (IoT) enabled device, embedded computer (e.g., one included in a vehicle, industrial equipment, or a networked commercial device), or such computing device that includes memory and a processing device.

The computing system 100 can include a host system 120 that is coupled to one or more memory sub-systems 110. In some embodiments, the host system 120 is coupled to different types of memory sub-system 110. FIG. 1 illustrates one example of a host system 120 coupled to one memory sub-system 110. As used herein, "coupled to" or "coupled with" generally refers to a connection between components, which can be an indirect communicative connection or direct communicative connection (e.g., without intervening components), whether wired or wireless, including connections such as electrical, optical, magnetic, etc.

The host system 120 can include a processor chipset and a software stack executed by the processor chipset. The processor chipset can include one or more cores, one or more caches, a memory controller (e.g., NVDIMM controller), and a storage protocol controller (e.g., PCIe controller, SATA controller). The host system 120 uses the memory sub-system 110, for example, to write data to the memory sub-system 110 and read data from the memory sub-system 110.

The host system 120 can be coupled to the memory sub-system 110 via a physical host interface. Examples of a physical host interface include, but are not limited to, a serial advanced technology attachment (SATA) interface, a peripheral component interconnect express (PCIe) interface, universal serial bus (USB) interface, Fibre Channel, Serial Attached SCSI (SAS), a double data rate (DDR) memory bus, Small Computer System Interface (SCSI), a dual in-line memory module (DIMM) interface (e.g., DIMM socket interface that supports Double Data Rate (DDR)), etc. The physical host interface can be used to transmit data between the host system 120 and the memory sub-system 110. The host system 120 can further utilize an NVM Express (NVMe) protocol to access components (e.g., memory devices 130) when the memory sub-system 110 is coupled with the host system 120 by the PCIe interface. The physical host interface can provide an interface for passing control, address, data, and other signals between the memory sub-system 110 and the host system 120. FIG. 1 illustrates a memory sub-system 110 as an example. In general, the host system 120 can access multiple memory sub-systems via a same communication connection, multiple separate communication connections, and/or a combination of communication connections.

The memory devices 130, 140 can include various combinations of the different types of non-volatile memory devices and/or volatile memory devices. The volatile memory devices (e.g., memory device 140) can be, but are not limited to, random access memory (RAM), such as dynamic random access memory (DRAM) and synchronous dynamic random access memory (SDRAM).

Some examples of non-volatile memory devices (e.g., memory device 130) includes negative-and (NAND) type flash memory and write-in-place memory, such as a three-dimensional cross-point ("3D cross-point") memory device, which is a cross-point array of non-volatile memory cells. A cross-point array of non-volatile memory can perform bit storage based on a change of bulk resistance, in conjunction with a stackable cross-gridded data access array. Additionally, in contrast to many flash-based memories, cross-point non-volatile memory can perform a write in-place operation, where a non-volatile memory cell can be programmed without the non-volatile memory cell being previously erased. NAND type flash memory includes, for example, two-dimensional NAND (2D NAND) and three-dimensional NAND (3D NAND).

Although non-volatile memory components such as 3D cross-point array of non-volatile memory cells and NAND type memory (e.g., 2D NAND, 3D NAND) are described, the memory device 130 can be based on any other type of non-volatile memory or storage device, such as read-only memory (ROM), phase change memory (PCM), self-selecting memory, other chalcogenide based memories, ferroelectric transistor random-access memory (FeTRAM), ferroelectric random access memory (FeRAM), magneto random access memory (MRAM), Spin Transfer Torque (STT)-MRAM, conductive bridging RAM (CBRAM), resistive random access memory (RRAM), oxide based RRAM (OxRAM), negative-or (NOR) flash memory, and electrically erasable programmable read-only memory (EEPROM).

A non-volatile dual in-line memory module (NVDIMM) is a type of random-access memory that has volatile memory for normal operation and non-volatile memory in which to store the contents of the volatile memory if the power fails, using an on-board backup power source. A host, with respect to a memory unit, can be structured as one or more processors that control data in and out of the memory unit in response to instructions (e.g., an application, program, etc.) being executed by the host. In the event of a power failure, the NVDIMM can copy all the data from its volatile memory (e.g., DRAM or set of DRAMS) to its persistent flash storage and can copy all the data back to the volatile memory when power is restored. The transfer of the state of all the DRAM data into persistent data on the persistent flash storage can be performed on a power cycle. While the example described above refers to a persistent flash storage, embodiments are not so limited. As an example, some embodiments can include persistent storage that is a non-flash persistent storage. The NVDIMM has its own battery backup power source or access to a dedicated power source to allow the NVDIMM to complete the save.

NVDIMMs can include a variety of different types (N, P, X, F). NVDIMM-N is a dual in-line memory module (DIMM) typically with flash storage and traditional dynamic random-access memory (DRAM) on the same module. A host processing unit can access the traditional DRAM directly. NVDIMM-P can include main memory that is persistent and can share a DDR4 or DDR5 DIMM interconnect with DRAM DIMMs. NVDIMM-X can include a DDR4 DIMM with NAND flash storage and volatile DRAM on a same module. NVDIMM-F can include an NVDIMM with flash storage.

Each of the memory devices 130 can include one or more arrays of memory cells. One type of memory cell, for example, single level cells (SLC) can store one bit per cell. Other types of memory cells, such as multi-level cells (MLCs), triple level cells (TLCs), and quad-level cells (QLCs), can store multiple bits per cell. In some embodiments, each of the memory devices 130 can include one or more arrays of memory cells such as SLCs, MLCs, TLCs, QLCs, or any combination of such. In some embodiments, a particular memory device can include an SLC portion, and an MLC portion, a TLC portion, or a QLC portion of memory cells. In some embodiments, each of the memory devices 130 can include one or more arrays of memory cells that are dynamic SLCs, meaning the memory cells can be used in either of an SLC mode or a non-SLC mode (e.g., MLCs, TLCs, QLCs) and can be converted from one to the other.

As discussed above, the storage mode by which data is stored can affect an error rate of the data. As an example, memory cells storing data in a non-SLC mode can be more prone to errors than cells storing data in an SLC mode when exposed to higher temperatures or other environmental factors. For this reason, it can be beneficial to store data in an SLC mode to withstand higher temperatures and then return to using cells storing data in a non-SLC mode when temperatures fluctuate less or are more likely to be at a lower temperature. Further, the memory cells of the memory devices 130 can be grouped as pages that can refer to a logical unit of the memory device used to store data. With some types of memory (e.g., NAND), pages can be grouped to form blocks, as will be further described below in FIG. 2.

A memory sub-system controller 115 (or controller 115 for simplicity) can communicate with the memory devices 130 to perform operations such as reading data, writing data, or erasing data at the memory devices 130 and other such operations. The memory sub-system controller 115 can include hardware such as one or more integrated circuits and/or discrete components, a buffer memory, or a combination thereof. The hardware can include digital circuitry with dedicated (i.e., hard-coded) logic to perform the operations described herein. The memory sub-system controller 115 can be a microcontroller, special purpose logic circuitry (e.g., a field programmable gate array (FPGA), an application specific integrated circuit (ASIC), etc.), or other suitable processor.

The memory sub-system controller 115 can include a processor 117 (processing device) configured to execute instructions stored in a local memory 119. In the illustrated example, the local memory 119 of the memory sub-system controller 115 includes an embedded memory configured to store instructions for performing various processes, operations, logic flows, and routines that control operation of the memory sub-system 110, including handling communications between the memory sub-system 110 and the host system 120.

In some embodiments, the local memory 119 can include memory registers storing memory pointers, fetched data, etc. The local memory 119 can also include read-only memory (ROM) for storing micro-code. While the example memory sub-system 110 in FIG. 1 has been illustrated as including the memory sub-system controller 115, in another embodiment of the present disclosure, a memory sub-system 110 does not include a memory sub-system controller 115, and can instead rely upon external control (e.g., provided by an external host, or by a processor or controller separate from the memory sub-system).

In general, the memory sub-system controller 115 can receive commands or operations from the host system 120 and can convert the commands or operations into instructions or appropriate commands to achieve the desired access to the memory device 130 and/or the memory device 140. The memory sub-system controller 115 can be responsible for other operations such as wear leveling operations, garbage collection operations, error detection and error-correcting code (ECC) operations, encryption operations, caching operations, and address translations between a logical address (e.g., logical block address (LBA), namespace) and a physical address (e.g., physical block address) that are associated with the memory devices 130. The memory sub-system controller 115 can further include host interface circuitry to communicate with the host system 120 via the physical host interface. The host interface circuitry can convert the commands received from the host system into command instructions to access the memory device 130 and/or the memory device 140 as well as convert responses associated with the memory device 130 and/or the memory device 140 into information for the host system 120.

The memory sub-system 110 can also include additional circuitry or components that are not illustrated. In some embodiments, the memory sub-system 110 can include a cache or buffer (e.g., DRAM) and address circuitry (e.g., a row decoder and a column decoder) that can receive an address from the memory sub-system controller 115 and decode the address to access the memory device 130 and/or the memory device 140.

In some embodiments, the memory device 130 includes local media controllers 135 that operate in conjunction with memory sub-system controller 115 to execute operations on one or more memory cells of the memory devices 130. An external controller (e.g., memory sub-system controller 115) can externally manage the memory device 130 (e.g., perform media management operations on the memory device 130). In some embodiments, a memory device 130 is a managed memory device, which is a raw memory device combined with a local controller (e.g., local controller 135) for media management within the same memory device package. An example of a managed memory device is a managed NAND (MNAND) device.

The memory sub-system 110 includes a storage mode component 113 that can be configured to orchestrate and/or perform operations to control a mode that data is stored in memory cells and communicate storage mode data on various components, data paths, and/or interfaces of the memory sub-system 110. Although not shown in FIG. 1 so as to not obfuscate the drawings, the storage mode component 113 can include various circuitry to facilitate control of the storage of data in the memory cells. For example, the storage mode component 113 can include a special purpose circuitry in the form of an ASIC, FPGA, state machine, and/or other logic circuitry or software and/or firmware that can allow the storage mode component 113 to orchestrate and/or perform data storage operations and communicate to various components, data paths, and/or interfaces of the memory sub-system 110.

The storage mode component 113 can be communicatively coupled to the memory devices 130 and can access the memory device 130, the memory device 140, internal data paths of the memory sub-system 110, and/or interfaces of the memory sub-system 110 to perform the operations described herein and/or to transfer the storage mode data to additional elements of the memory sub-system 110. In some embodiments, the operations performed by the storage mode component 113 can be performed during an initialization or pre-initialization stage of data transfer within the memory sub-system 110 and/or the memory sub-system controller 115. Accordingly, in some embodiments, the storage mode component 113 can perform the operations described herein prior to data transfer in order to determine a mode that data is stored in, which can affect subsequent data transfer speeds of the data out of the cells storing in that particular mode.

In some embodiments, the storage mode component 113 can include a flag that is asserted (e.g., set) in response to a determination that a manufacturing process to integrate the memory device 130/140 into a larger computing system is still being performed. The asserted flag can be a bit or a number of bits that indicate to store the data in memory cells in an SLC mode. Further, an additional flag of the storage mode component 113 can be asserted to indicate to maintain the data in a memory cell in an SLC mode. In this way, the initial storage of data and the transfer of data from one mode of storage to another can be prevented or allowed in order to control the mode that the data is stored in.

The memory device 130, 140 in FIG. 1 can include a number of physical blocks in accordance with a number of embodiments of the present disclosure. For example, the memory device 130, 140 can include a NAND flash memory array including the number of physical blocks. However, embodiments of the present disclosure are not limited to a particular type of memory or memory array. For example, the memory array can be a DRAM array, an RRAM array, or a PCRAM array, among other types of memory arrays. Further, the memory array can be located on a particular semiconductor die along with various peripheral circuitry associated with the operation thereof.

The memory cells of the memory array can be mixed mode cells operable as SLCs and/or XLCs (e.g., extra-level cells which can refer to cells operable at a level greater than SLCs). The number of physical blocks in the memory array may be 128 blocks, 512 blocks, or 1,024 blocks, but embodiments are not limited to a particular multiple of 128 or to any particular number of physical blocks in memory array. Further, different portions of memory can serve as a dynamic SLC cache for garbage collection purposes. For example, different portions of memory can be dynamically increased and/or decreased in size as demands on the memory are increased and/or decreased and garbage collection reduces these demands.

Each physical block of the memory array can contain a number of physical rows of memory cells coupled to access lines (e.g., word lines). The number of rows (e.g., word lines) in each physical block can be 32, but embodiments are not limited to a particular number of rows per physical block. Further, the memory cells can be coupled to sense lines (e.g., data lines and/or digit lines).

Each row can include a number of pages of memory cells (e.g., physical pages). A physical page refers to a unit of programming and/or sensing (e.g., a number of memory cells that are programmed and/or sensed together as a functional group). Each row can comprise one physical page of memory cells. However, embodiments of the present disclosure are not so limited. For instance, in a number of embodiments, each row can comprise multiple physical pages of memory cells (e.g., one or more even pages of memory cells coupled to even-numbered bit lines, and one or more odd pages of memory cells coupled to odd numbered bit lines). Additionally, for embodiments including XLCs, a physical page of memory cells can store multiple pages (e.g., logical pages) of data, for example, an upper page of data and a lower page of data, with each cell in a physical page storing one or more bits towards an upper page of data and one or more bits towards a lower page of data.

Figure 2A:
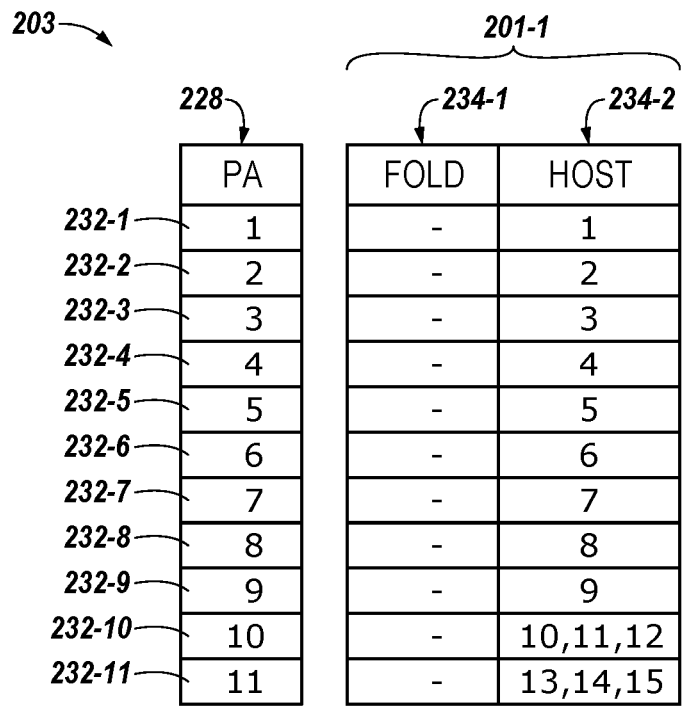
FIG. 2A illustrates an example of a portion of data stored in an SLC mode and a TLC mode in accordance with some embodiments of the present disclosure.
Figure 2B:
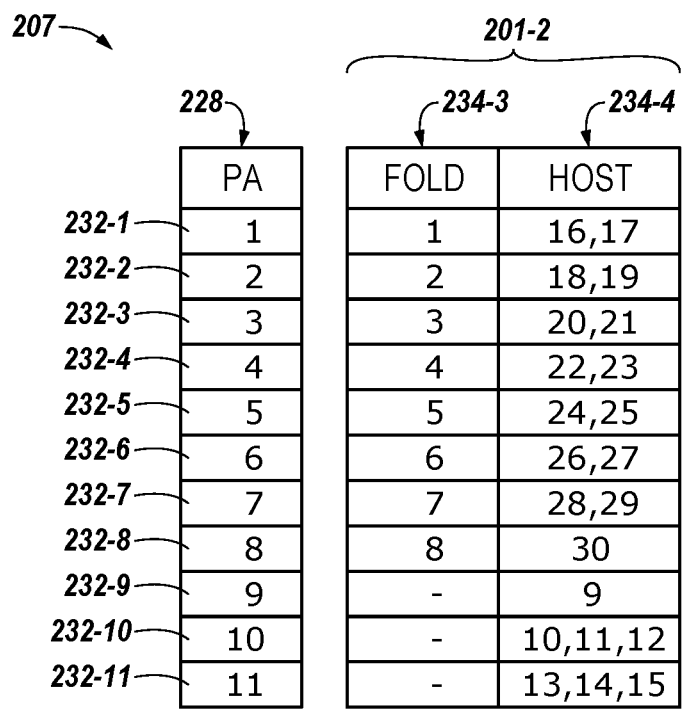
FIG. 2B illustrates an example of a portion of data associated with a garbage collection in accordance with some embodiments of the present disclosure.

FIGS. 2A and 2B illustrate respective diagrams 203/207 prior to (FIG. 2A 203) and subsequent to (FIG. 2B 207) performing a folding operation of a garbage collection.

Column 228 includes physical addresses (PAs) corresponding to blocks 232 of memory cells. Column 234-1 indicates blocks storing "folded" data (e.g., a portion of previously written host data in an SLC mode rewritten to a block in an MLC mode). Column 234-2 indicates blocks storing host data which has not been folded. In the example shown in FIGS. 2A and 2B, the blocks are TLC blocks such that each block can store a single data unit in SLC mode or 3 data units in TLC mode. In various embodiments, host data is written in SLC mode until the drive reaches a threshold level of saturation at which point folding occurs and/or data is written in XLC mode (e.g., TLC mode in this example). Folding can be associated with wear leveling and/or garbage collection operations.

In some embodiments, wear leveling on one or more blocks can be performed to control the wear rate of such memory devices. Wear leveling may reduce the number of process cycles (e.g., program and/or erase cycles) performed on a particular group of blocks by spreading such cycles more evenly over an entire memory array and/or memory device. Wear leveling can include static wear leveling and/or dynamic wear leveling to minimize the amount of valid blocks moved to reclaim a block. For example, static wear leveling may include writing static data to blocks that have high program/erase counts to prolong the life of the block. In some embodiments, wear leveling may include garbage collection operations.

Garbage collection may include reclaiming (e.g., erasing and making available for programming) blocks that have the most invalid pages among blocks in the memory device(s). In some embodiments, garbage collection may include reclaiming blocks with more than a threshold amount (e.g., quantity) of invalid pages. However, if sufficient free blocks exist for a programming operation, then a garbage collection operation may not occur. Garbage collection may generally be performed in the background (e.g., during idle time of the memory); however, in some embodiments, garbage collection may be performed in foreground, for instance in response to a determination that an amount of free blocks has decreased below a threshold free block count.

In some embodiments, the memory blocks in the memory device(s) can be mapped. For example, bad blocks that were discovered during wear leveling and/or garbage collection operations can be mapped to blocks that may still accept valid data. Further, a counter can be incremented that is associated with each block in response to the block being written and/or erased.

As illustrated in FIGS. 2A and 2B, each PA 228 can correspond to a block on the drive. In this case, both the garbage collection and host data can be written to the same block. In this example, in SLC mode, 1 unit of data may be written. In TLC mode, three (3) units of data may be written. While the example described in association with FIGS. 2A-2B show some of the cells in TLC mode, examples are not so limited. For example, additional examples may use the cells in QLC mode or MLC mode even though not shown here. A garbage collection component of the data can be written to the block, represented by 234-1 (which is empty in FIG. 2A due to it representing prior to the garbage collection), and a host portion of the data can be written to the block, represented by 234-2. In response to host data being written in SLC mode, one (1) unit of host data can be written to each PA. In response to data being written in TLC mode, three (3) units of data can be written to each PA. In the diagram 201-1, host data is written in SLC mode in PAs 232-1 to 232-9. Host data is written in TLC mode in PAs 232-10 and 232-11. At this point in this example, all the blocks can be completely used. To write additional host data, garbage collection can be performed on the blocks. The amount of garbage collection data written to the block is represented in column 234-3.

Memory 201-1 in FIG. 2A and 201-2 in FIG. 2B can represent portions of memory arrays such as an array of memory device 130 or 140 previously described in connection with FIG. 1, for example.

As shown in FIG. 2A, memory 201-1 is an illustration of a first fill (e.g., storage) of data. A host can store a first data unit "1" in a first block of a column 234-2 of blocks of memory. The first data unit "1" can be a data unit that is stored first in the memory 400-1. The first data unit "1" can be associated with a first physical address ("PA") 232-1 of "1." The first data unit "1" can be stored in an SLC mode and therefore a column 234-1 referred to as "Fold" would not be used as there is no data to be folded (included for illustrative purposes to correlate with the description below in association with memory 201-2 in FIG. 2B and shown in memory 201-1 to reiterate that no folding occurs in the initial storing of data from the host). For clarity, the "FOLD" and "HOST" portions of data in a same PA are in a same block. Further, as an example, a block may have no "fold" data if it is the first sequential fill.

Likewise, in FIG. 2A, a second data unit "2" can be stored by the host in a second block, associated with PA 232-2 (e.g., "2"), of the column 234-2 of blocks of memory. The second data unit "2" can be stored second in order and subsequent to the first data unit being stored. A third through ninth data unit, "3" through "9," can be stored in a third through ninth block (associated with PA 232-3 (e.g., "3") through PA 232-9 (e.g., "9")) of the column 234-2 of blocks of memory in an SLC mode. The third through ninth data unit can be stored in increasing order from third to ninth and subsequent to the first and the second data unit.

In some embodiments, using a dynamic SLC caching method can include initially writing host data to blocks of memory that are capable of XLC mode in an SLC mode until available SLC mode blocks are used up. This can provide quicker data access until storing the data in an XLC mode to preserve data storage capacity. For example, when XLC cells are used in an SLC mode, anywhere from ½, ⅓, to ¼ the size of the cell capacity is being used (depending on if XLC mode is referring to multi-cell mode (2 data values stored in one cell), tri-level cell mode (3 data values stored in one cell), or quad-level mode (4 data values stored in one cell)). Hence, the free blocks of memory can be filled if using an SLC mode before the full storage capacity of available SLC blocks of memory has been reached. Garbage collection can refer to moving host data written in SLC mode to data written in an XLC mode to create additional storage capacity. If the garbage collection was not performed in order to do so, a write protect mode may be initiated to avoid malfunction.

As data storage capacity of the memory becomes limited, in a dynamic SLC caching method, additional host data can be initially written in an XLC mode. For example, as illustrated in FIG. 2A, a tenth "10," eleventh "11," and twelfth "12" data unit can be stored in a tenth block of the column 234-2 associated with 2A 232-10 (e.g., "10") in an XLC mode. For example, the tenth "10" data unit can be an upper page data unit of the tenth block, the eleventh "11" data unit can be a middle page data unit of the tenth block, and the twelfth "12" data unit can be a lower page data unit of the tenth block. A thirteenth "13," fourteenth "14," and fifteenth "15" data unit can be stored in an eleventh block of the column 234-2 associated with PA 232-11 (e.g., "11") in an XLC mode. For example, the thirteenth "13" data unit can be an upper page data unit of the eleventh block, the fourteenth "14" data unit can be a middle page data unit of the eleventh block, and the fifteenth "15" data unit can be a lower page data unit of the eleventh block.

While a single data unit is illustrated as shown in each block for purposes of this example, embodiments are not so limited. Any number of data units can be stored in a block of memory and any number of data units per fill can be used. For example, data units "1" through "15" are stored initially in memory 201-1, as illustrated in FIG. 2A, and data units "1" through "30" are stored in memory 201-2, as illustrated in FIG. 2B, as the host continues to store data units "16" through "30" by garbage collecting. However, embodiments are not limited to 30 total data units per fill.

As additional host data is written to the blocks of memory, host data and data already garbage collected can be written together to a block of memory. This can create a logically non-sequential storage of data even though the host data is being transferred sequentially. Due to data fragmentation introduced by this dynamic SLC caching, several logical fills can be used to eliminate logical randomness of data. The number of fills used to recover from fragmentation can be a function of the fragmentation introduced in the first initial writes. In accordance with embodiments described below, a garbage collection is described that creates an imbalance between a number of blocks of memory already written to and the number of blocks freed up for being written to. Put another way, more blocks of memory are freed up than are being written to. In order to accomplish this, the number of blocks filled with host data and garbage collected data is reduced.

As illustrated in FIG. 2B, a garbage collection can be performed on data (stored in memory 201-1 of FIG. 2A) and results of the garbage collection stored as illustrated in memory 201-2. For example, the first data unit "1" stored in memory 201-1 in an SLC mode can be garbage collected and folded, as illustrated by column 234-3, while a sixteenth data unit "16" and a seventeenth data unit "17" is written by the host to the first block of memory 201-2 associated with physical address "1" 232-1. Folding can refer to changing a data unit from being stored in a SLC mode to being stored in a new location within a cell in XLC mode. The fold column 234-3 is used to illustrate which data units are folded from a previous location during garbage collection. Likewise, the second data unit "2" stored in memory 201-1 in an SLC mode can be garbage collected and folded together with an eighteenth data unit and a nineteenth data unit to be written as merged together in an XLC mode in the second block associated with PA 232-2 (e.g., "2"), a third data unit "3" can be merged with a twentieth data unit and a twenty-first data unit, . . . , an eighth data unit can be merged with a thirtieth data unit and a thirty-first data unit. The data units ("9," "10," "11," "12," "13," "14," and "15") stored in blocks associated with PAs 232-9, 232-10, 232-11 (e.g., "9," "10," and "11") can remain unchanged. The data stored in memory 201-2 after this garbage collection can be referred to as a first "fill."

In this example, the data stored in memory 201-2 includes many blocks with "Fold" and "Host" data within a same block. For example, the $1^{st}$, $2^{nd}$, $3^{rd}$, $4^{th}$, $5^{th}$, $6^{th}$, $7^{th}$ and $8^{th}$ blocks all include fragmented data (and are the only blocks that experienced garbage collection). In one example, as these $1^{st}$ through $8^{th}$ data units are folded with the $16^{th}$ through 30 data units, respectively, as illustrated in FIG. 2B, data stored in an SLC mode are combined to be stored with additional data units in a non-SLC mode. While not illustrated, data units stored in an SLC mode can be combined or folded with data units stored in a non-SLC mode and subsequently stored as combined or folded data units in a non-SLC mode.

Storage of data in a non-SLC mode is more prone to damage and/or errors when exposed to higher temperatures than data stored in SLC mode. In order to avoid these negative affects of high temperature, the folding of data can be prevented during a particular period of time or until a threshold parameter is achieved. For example, folding of the data can be prevented until a threshold number of power cycles have been performed on the data. In this way, a manufacturing process to integrate a memory device into a larger computing system, which may include performing many power cycles, can be performed while the data is prevented from folding and, subsequent to the manufacturing process, the data can be allowed to fold as intended to more efficiently store the data. In addition, a flag can be asserted to indicate to store and/or maintain the data in cells in an SLC mode. In response to de-assertion of the flag, the data can be allowed to be folded into cells in a non-SLC mode upon a next power cycle, for example.

Figure 3A:
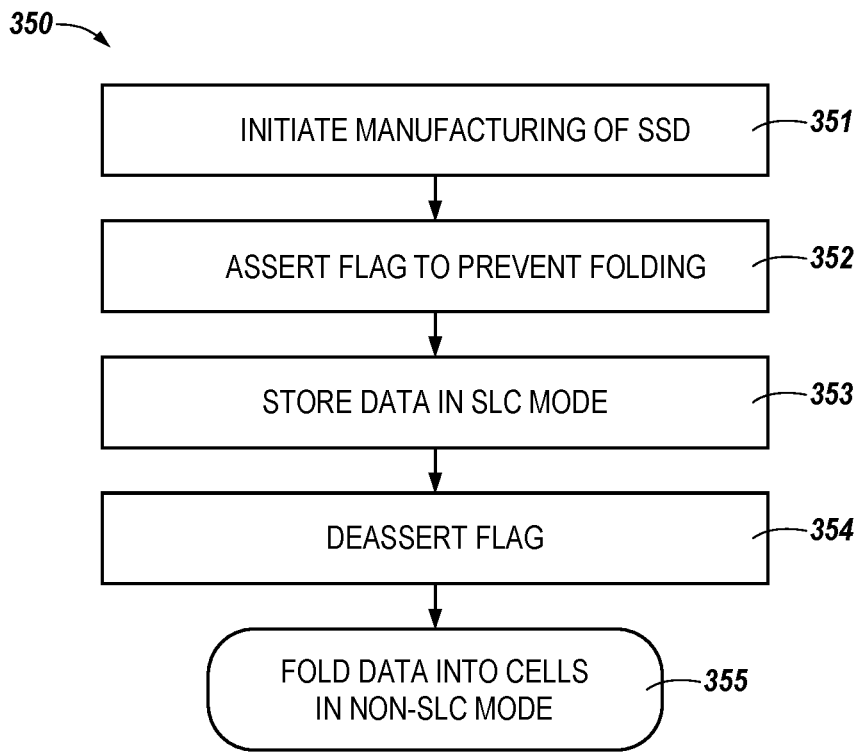
FIG. 3A illustrates a flow diagram corresponding to memory sub-system operations to memory cell type control in accordance with some embodiments of the present disclosure.

FIGS. 3A-4 each illustrate a flow diagram corresponding to a method 350, 360, 470 for performing memory sub-system operations to control a storage mode in accordance with some embodiments of the present disclosure. Each respective method 350, 360, 470 can be performed by processing logic that can include hardware (e.g., processing device, circuitry, dedicated logic, programmable logic, microcode, hardware of a device, integrated circuit, etc.), software (e.g., instructions run or executed on a processing device), or a combination thereof. In some embodiments, each method 350, 360, 470 is performed by the storage mode component 113 of FIG. 1. Although shown in a particular sequence or order, unless otherwise specified, the order of the processes can be modified. Thus, the illustrated embodiments should be understood only as examples, and the illustrated processes can be performed in a different order, and some processes can be performed in parallel. Additionally, one or more processes can be omitted in various embodiments. Thus, not all processes are required in every embodiment. Other process flows are possible.

FIG. 3A illustrates a flow diagram 350 corresponding to memory sub-system operations to control a storage mode in accordance with some embodiments of the present disclosure. At operation 351, the manufacturing of a system (e.g., a memory sub-system) which includes an SSD can be initiated. At operation 352, the storage mode component (e.g., storage mode component 113) can assert a flag to prevent the folding of data. As an example, a flag can be asserted to prevent data from being transferred from a cell storing data in an SLC mode to a cell storing data in a non-SLC mode. The flag can be asserted using a number of bits that indicate that the flag is either asserted (e.g., set) or de-asserted (e.g., not set).

At operation 353, a memory sub-system controller can check the flag and, determining that the flag is asserted, store data in cells in an SLC mode only. Data can continue to be stored in cells in an SLC mode throughout a manufacturing process. The manufacturing process can include performing a number of tests on the system and/or the data stored in the SSD and a number of power cycles can be performed to do so. In the absence of the flag being asserted, the SSD may garbage collect or fold the data to be stored in a non-SLC mode but, since the flag is asserted, in this instance the SSD would not. At operation 354, at the conclusion of the manufacturing process, or when a threshold is reached (e.g., a threshold of power cycles), the flag can be de-asserted. At operation 355, in response to the flag being de-asserted, the data can be folded into cells in a non-SLC mode at a next power cycle.

Figure 3B:
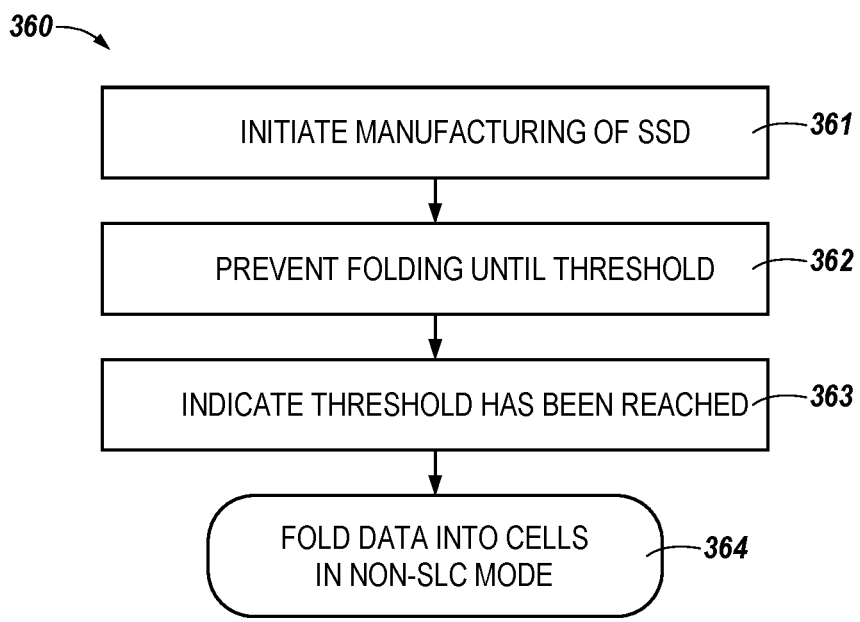
FIG. 3B illustrates a flow diagram corresponding to memory sub-system memory cell type control in accordance with some embodiments of the present disclosure.

FIG. 3B illustrates a flow diagram 360 corresponding to memory sub-system operations to control a storage mode in accordance with some embodiments of the present disclosure. At operation 361, the manufacturing of a system (e.g., a memory sub-system) using an SSD can be initiated. At operation 362, the SSD can be prevented from folding data until a threshold number of power cycles is reached. In this way, the data can remain in an SLC mode until the threshold is reached. Data can continue to be stored in cells in an SLC mode throughout a manufacturing process as long as the threshold has not been reached. The manufacturing process can include performing a number of tests on the data in the SSD and a number of power cycles can be performed to do so.

At operation 363, a memory sub-system controller can determine that a threshold has been reached (e.g., that a number of power cycles has been performed). At operation 364, in response to the determination that the threshold has been reached, the data can be folded into cells in a non-SLC mode.

FIG. 4 is a flow diagram corresponding to a method 470 for performing memory sub-system operations to control a storage mode in accordance with some embodiments of the present disclosure. The method 470 can be performed by processing logic that can include hardware (e.g., processing device, circuitry, dedicated logic, programmable logic, microcode, hardware of a device, integrated circuit, etc.), software (e.g., instructions run or executed on a processing device), or a combination thereof. At operation 471, the method 470 can include preventing data (e.g., operating system or vendor-provided data) written to memory cells of a memory device in a single level cell (SLC) mode from being stored in memory cells in a non-single level cell (non-SLC) mode. In one example, the vendor-provided data can be operating system data that is provided by the vendor. In one example, the vendor-provided data can be data other than operating system data. The storage mode component can be analogous to the storage mode component 113 of FIG. 1. The memory device can be analogous to the memory device 130 and/or the memory device 140 of FIG. 1.

At operation 473, the method 470 can include, in response to performance of a particular quantity of power cycles of the memory device, allowing the data (e.g., operating system or vendor-provided data) written to the memory cells in the SLC mode to be stored in the memory cells in the non-SLC mode. Performance of the particular quantity of power cycles can be associated with a quantity of power cycles used to manufacture the system by integrating the memory device. Performance of the particular quantity of power cycles can be associated with a quantity of power cycles used to manufacture and test the system including the memory device.

In some embodiments, the memory device including the memory cells can be a volatile memory device and the memory device different than the memory device can be a non-volatile memory device (or vice versa). For example, the memory device can be a system memory device, such as a DRAM (e.g., a dual-ported RAM) memory device, and the memory device different than the memory device can be a storage device, such as a NAND memory device, a three-dimensional cross-point memory device, or other non-volatile memory device.

The method 470 can further include writing the data to the memory cells in the non-SLC mode. The method 470 can further include preventing data written to a portion of the memory cells from being stored in memory cells in a non-SLC mode subsequent to performance of the quantity of power cycles. The quantity of power cycles can be associated with a quantity of power cycles used to manufacture and test the system and memory device. In some examples, the data written to the portion of the memory cells can be prevented from being stored in the memory cells in the non-SLC mode in response to an indication of an expected frequency of access of the portion of the memory cells. In some examples, the method 470 can further include, in response to completion of a manufacturing process and vendor-provided modification of the memory device, allowing the data (e.g., operating system or vendor-provided data) written to the memory cells in the SLC mode to be stored in memory cells in the non-SLC mode.

Figure 5:
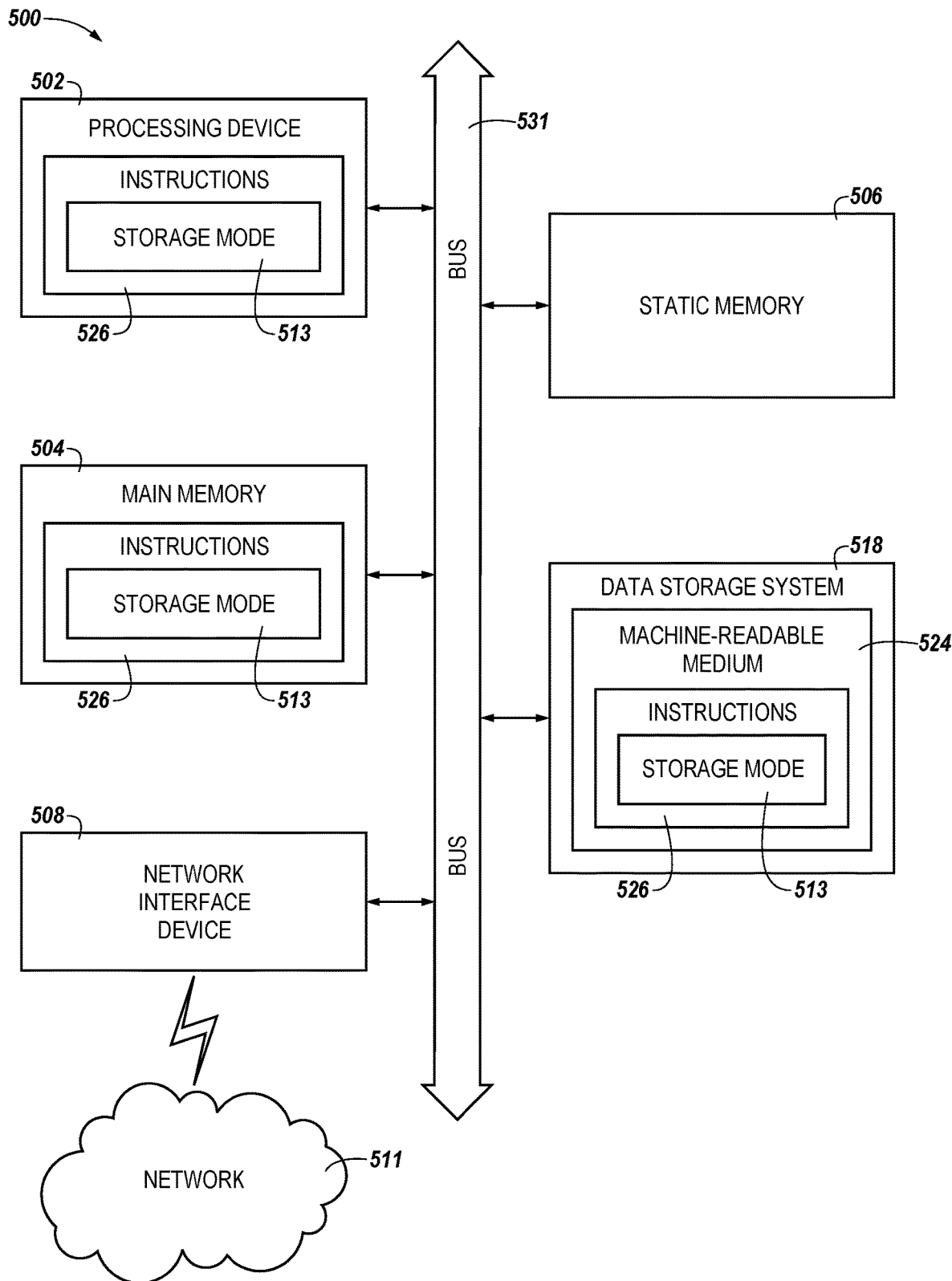
FIG. 5 is a block diagram of an example computer system in which embodiments of the present disclosure may operate.

FIG. 5 illustrates an example machine of a computer system 500 within which a set of instructions, for causing the machine to perform any one or more of the methodologies discussed herein, can be executed. In some embodiments, the computer system 500 can correspond to a host system (e.g., the host system 120 of FIG. 1) that includes, is coupled to, or utilizes a memory sub-system (e.g., the memory sub-system 110 of FIG. 1) or can be used to perform the operations of a controller (e.g., to execute an operating system to perform operations corresponding to the storage mode component 113 of FIG. 1). In alternative embodiments, the machine can be connected (e.g., networked) to other machines in a LAN, an intranet, an extranet, and/or the Internet. The machine can operate in the capacity of a server or a client machine in client-server network environment, as a peer machine in a peer-to-peer (or distributed) network environment, or as a server or a client machine in a cloud computing infrastructure or environment.

The machine can be a personal computer (PC), a tablet PC, a set-top box (STB), a Personal Digital Assistant (PDA), a cellular telephone, a web appliance, a server, a network router, a switch or bridge, or any machine capable of executing a set of instructions (sequential or otherwise) that specify actions to be taken by that machine. Further, while a single machine is illustrated, the term "machine" shall also be taken to include any collection of machines that individually or jointly execute a set (or multiple sets) of instructions to perform any one or more of the methodologies discussed herein.

The example computer system 500 includes a processing device 502, a main memory 504 (e.g., read-only memory (ROM), flash memory, dynamic random access memory (DRAM) such as synchronous DRAM (SDRAM) or Rambus DRAM (RDRAM), etc.), a static memory 506 (e.g., flash memory, static random access memory (SRAM), etc.), and a data storage system 518, which communicate with each other via a bus 531.

The processing device 502 represents one or more general-purpose processing devices such as a microprocessor, a central processing unit, or the like. More particularly, the processing device can be a complex instruction set computing (CISC) microprocessor, reduced instruction set computing (RISC) microprocessor, very long instruction word (VLIW) microprocessor, or a processor implementing other instruction sets, or processors implementing a combination of instruction sets. The processing device 502 can also be one or more special-purpose processing devices such as an application specific integrated circuit (ASIC), a field programmable gate array (FPGA), a digital signal processor (DSP), network processor, or the like. The processing device 502 is configured to execute instructions 526 for performing the operations and steps discussed herein. The computer system 500 can further include a network interface device 508 to communicate over the network 511. In some embodiments, the main memory 504 or system 518 can be an NVDIMM such as is described in association with FIG. 2.

The data storage system 518 can include a machine-readable storage medium 524 (also known as a computer-readable medium) on which is stored one or more sets of instructions 526 or software embodying any one or more of the methodologies or functions described herein. The instructions 526 can also reside, completely or at least partially, within the main memory 504 and/or within the processing device 502 during execution thereof by the computer system 500, the main memory 504 and the processing device 502 also constituting machine-readable storage media. The machine-readable storage medium 524, data storage system 518, and/or main memory 504 can correspond to the memory sub-system 110 of FIG. 1.

In one embodiment, the instructions 526 include instructions to implement functionality corresponding to a memory block grading and allocation component (e.g., the storage mode component 113 of FIG. 1). While the machine-readable storage medium 524 is shown in an example embodiment to be a single medium, the term "machine-readable storage medium" should be taken to include a single medium or multiple media that store the one or more sets of instructions. The term "machine-readable storage medium" shall also be taken to include any medium that is capable of storing or encoding a set of instructions for execution by the machine and that cause the machine to perform any one or more of the methodologies of the present disclosure. The term "machine-readable storage medium" shall accordingly be taken to include, but not be limited to, solid-state memories, optical media, and magnetic media.

Some portions of the preceding detailed descriptions have been presented in terms of algorithms and symbolic representations of operations on data bits within a computer memory. These algorithmic descriptions and representations are the ways used by those skilled in the data processing arts to most effectively convey the substance of their work to others skilled in the art. An algorithm is here, and generally, conceived to be a self-consistent sequence of operations leading to a desired result. The operations are those requiring physical manipulations of physical quantities. Usually, though not necessarily, these quantities take the form of electrical or magnetic signals capable of being stored, combined, compared, and otherwise manipulated. It has proven convenient at times, principally for reasons of common usage, to refer to these signals as bits, values, elements, symbols, characters, terms, numbers, or the like.

It should be borne in mind, however, that all of these and similar terms are to be associated with the appropriate physical quantities and are merely convenient labels applied to these quantities. The present disclosure can refer to the action and processes of a computer system, or similar electronic computing device, that manipulates and transforms data represented as physical (electronic) quantities within the computer system's registers and memories into other data similarly represented as physical quantities within the computer system memories or registers or other such information storage systems.

The present disclosure also relates to an apparatus for performing the operations herein. This apparatus can be specially constructed for the intended purposes, or it can include a general purpose computer selectively activated or reconfigured by a computer program stored in the computer. Such a computer program can be stored in a computer readable storage medium, such as, but not limited to, any type of disk including solid state drives (SSDs), hard disk drives (HDDs), floppy disks, optical disks, CD-ROMs, and magnetic-optical disks, read-only memories (ROMs), random access memories (RAMs), EPROMs, EEPROMs, magnetic or optical cards, or any type of media suitable for storing electronic instructions, each coupled to a computer system bus.

The algorithms and displays presented herein are not inherently related to any particular computer or other apparatus. Various general purpose systems can be used with programs in accordance with the teachings herein, or it can prove convenient to construct a more specialized apparatus to perform the method. The structure for a variety of these systems will appear as set forth in the description below. In addition, the present disclosure is not described with reference to any particular programming language. It will be appreciated that a variety of programming languages can be used to implement the teachings of the disclosure as described herein.

The present disclosure can be provided as a computer program product, or software, that can include a machine-readable medium having stored thereon instructions, which can be used to program a computer system (or other electronic devices) to perform a process according to the present disclosure. A machine-readable medium includes any mechanism for storing information in a form readable by a machine (e.g., a computer). In some embodiments, a machine-readable (e.g., computer-readable) medium includes a machine (e.g., a computer) readable storage medium such as a read only memory ("ROM"), random access memory ("RAM"), magnetic disk storage media, optical storage media, flash memory devices, etc.

In the foregoing specification, embodiments of the disclosure have been described with reference to specific example embodiments thereof. It will be evident that various modifications can be made thereto without departing from the broader spirit and scope of embodiments of the disclosure as set forth in the following claims. The specification and drawings are, accordingly, to be regarded in an illustrative sense rather than a restrictive sense.

What is claimed is:

1. A system, comprising:
a memory device comprising memory cells; and
a processing device coupled to the memory device, the processing device to perform operations comprising:
asserting a flag indicating that data written to the memory cells in an SLC mode is to remain stored in the SLC mode; and
in response to determination of an event, de-asserting the flag, thereby indicating that the data is foldable into memory cells in a non-SLC mode.

2. The system of claim 1, wherein the event comprises a threshold number of power cycles being performed.

3. The system of claim 1, wherein the event comprises completion of at least a portion of a manufacturing process.

4. The system of claim 1, wherein the processing device is to perform operations comprising storing data in the memory cells in a particular memory mode.

5. The system of claim 4, wherein the particular memory mode comprises a single level cell (SLC) mode.

6. The system of claim 5, wherein the processing device to perform storing the data further comprises the processing device to perform storing vendor-provided data.

7. The system of claim 5, wherein the processing device to perform storing the data further comprises the processing device to perform storing operating system data.

8. The system of claim 1, wherein the processing device is to perform operations further comprising maintaining the asserted flag in response to a particular expected frequency of access of the memory cells.

9. A system, comprising:
a memory device comprising memory cells; and
a processing device coupled to the memory device, the processing device to perform operations comprising:
preventing data written to memory cells of a memory device in a single level cell (SLC) mode from being stored in memory cells in a non-single level cell (non-SLC) mode; and
in response to a determination of an event, allowing the data written to the memory cells in the SLC mode to be stored in memory cells in the non-SLC mode at determination of a subsequent event.

10. The method of claim 9, wherein the event comprises a quantity of power cycles of the memory device being performed.

11. The method of claim 9, wherein the event comprises completion of at least a portion of a manufacturing process.

12. The method of claim 9, where the data comprises operating system data or vendor-provided data, or both.

13. The method of claim 9, wherein:
the event is performance of a particular quantity of power cycles; and
the subsequent event comprises a next power cycle subsequent to performance of the particular quantity of power cycles.

14. The method of claim 9, wherein the subsequent event comprises a post-manufacturing use by a user.

15. The method of claim 9, further comprising, in response to completion of a manufacturing process and vendor-provided modification of the memory device, allowing an operating system of the memory device or vendor-provided data written to the memory cells in the SLC mode to be stored in memory cells in the non-SLC mode.

16. The method of claim 9, wherein the particular event is a quantity of power cycles used to manufacture and test the memory device.

17. An apparatus, comprising:
a memory device comprising:
a first array of memory cells for writing data in a single level cell (SLC) mode; and
a second array of memory cells for writing data in a non-SLC mode;
a processing device coupled to the memory device, the processing device to perform operations comprising de-asserting a flag indicating to maintain the data stored in the first array in the first array, wherein the flag is de-asserted in response to receipt of an indication that a manufacturing process has been completed.

18. The apparatus of claim 17, the processing device to perform operations comprising asserting an additional flag indicating to store data to the first array prior to assertion of the flag.

19. An apparatus, comprising:
a memory device comprising:
a first array of memory cells for writing data in a single level cell (SLC) mode; and
a second array of memory cells for writing data in a non-SLC mode;
a processing device coupled to the memory device, the processing device to perform operations comprising de-asserting a flag indicating to maintain the data stored in the first array in the first array, wherein the flag is de-asserted in response to receipt of an indication that a threshold number of power cycles have been performed.

20. The apparatus of claim 19, the processing device to perform operations comprising asserting an additional flag indicating to store data to the first array prior to assertion of the flag.

* * * * *